United States Patent
Shannon et al.

(10) Patent No.: US 7,723,667 B2
(45) Date of Patent: May 25, 2010

(54) PHOTOTRANSISTOR WITH SOURCE LAYER BETWEEN BARRIER LAYER AND PHOTOSENSITIVE SEMICONDUCTOR LAYER AND A GATE LAYER FOR CONTROLLING THE BARRIER HEIGHT OF THE BARRIER LAYER

(75) Inventors: John M. Shannon, Whyteleafe (GB); Stanley D. Brotherton, Forest Row (GB)

(73) Assignee: ST-Ericsson SA, Plan-les-Ouates (CH)

( * ) Notice: Subject to any disclaimer, the term of this patent is extended or adjusted under 35 U.S.C. 154(b) by 968 days.

(21) Appl. No.: 10/586,807

(22) PCT Filed: Jan. 21, 2005

(86) PCT No.: PCT/IB2005/050248
§ 371 (c)(1),
(2), (4) Date: Jul. 21, 2006

(87) PCT Pub. No.: WO2005/080822
PCT Pub. Date: Sep. 1, 2005

(65) Prior Publication Data
US 2009/0206237 A1    Aug. 20, 2009

(30) Foreign Application Priority Data
Jan. 24, 2004    (GB) .................................. 0401578.0

(51) Int. Cl.
*H01L 31/00* (2006.01)
(52) U.S. Cl. .............................. 250/214.1; 250/214 LA
(58) Field of Classification Search .............. 250/214.1, 250/214 R, 214 LA, 214 P; 257/329–332, 257/192–197, 290–292
See application file for complete search history.

(56) References Cited

U.S. PATENT DOCUMENTS 7,132,713 B2 *   11/2006   Nakazato et al. ............ 257/329

OTHER PUBLICATIONS

Gadelrab S. M. : "The Source-Gated Amorphous Silicon Photo-Transistor"; IEEE Electron Devices vol. 44 No. 10; Oct. 1997. pp. 1789-1794.
Shannon J. M. et al. :"Source-Gated Thin-Film Transistors"; IEEE Electron Device Letters vol. 24 No. 6; Jun. 2003. pp. 405-407.

* cited by examiner

*Primary Examiner*—Que T Le
(74) *Attorney, Agent, or Firm*—Robert Iannucci; Seed IP Law Group PLLC

(57) ABSTRACT

A photo transistor has an active region spaced from a source by barrier. A drain is laterally spaced from the active region. Light incident on the active region creates electron-hole pairs. Holes accumulate at the barrier and modulate the effective barrier height to electrons. A gate reset voltage then is applied to gate which lower the barrier allowing the holes to escape.

11 Claims, 3 Drawing Sheets

PHOTOTRANSISTOR WITH SOURCE LAYER BETWEEN BARRIER LAYER AND PHOTOSENSITIVE SEMICONDUCTOR LAYER AND A GATE LAYER FOR CONTROLLING THE BARRIER HEIGHT OF THE BARRIER LAYER

BACKGROUND

1. Technical Field

The invention relates to a phototransistor and a method of operation of such a phototransistor.

2. Description of the Related Art

Phototransistors are useful for detecting optical information in general and low light levels in particular.

A bipolar phototransistor is a classic example of a phototransistor that amplifies the photocurrent generated by incident light. The bipolar transistor has good output characteristics since the output is a high impedance current source which is easy to interface. Unfortunately it is difficult to make bipolar transistors with good performance in amorphous silicon or polysilicon which are suitable for so-called large area technologies, such as those used in imagers.

Thin film phototransistors do exist and a conventional thin film phototransistor is illustrated in FIG. 1. The structure is formed on a substrate 2, typically glass or plastic. A gate 4 is formed over the substrate, and the whole surface covered in turn with a gate insulator 6 and a layer of semiconductor 8. The semiconductor 8 acts as the photosensitive layer, and may typically be doped amorphous silicon (a-Si:H). A source contact 10 formed from a highly doped layer 12 and a metallic contact 14 is formed at one end, and a similar drain contact 16 is formed at the other end of the device also having a highly doped layer 12 and metallic contact 14. A protective layer 18, for example of nitride, protects the structure.

The resistance of the a-Si:H layer 8 is high in the absence of light and this high resistance reduces to a very low level the current passing through the transistor formed by source 10, gate 4 and drain 16.

When the device is illuminated, electron-hole pairs are created in the a-Si:H layer 8 and this very significantly reduces the resistance of the transistor thereby increasing the current when the transistor is switched on by applying a suitable voltage to the gate 4.

However, such prior art phototransistors are not very sensitive since no more than one electron and one hole is created per photon. This means that high light levels are required.

Thus, there is a need for an improved phototransistor capable of being integrated into large-area and/or thin-film circuits.

BRIEF SUMMARY

According to the invention there is provided a phototransistor, comprising:

a photo-sensitive semiconductor layer;

a barrier layer extending across an active region of the semiconductor layer under or over the photo-active layer;

a drain region laterally spaced from the active region of the semiconductor layer under or over the barrier layer;

a drain contact connected to the drain region;

a source layer on the other side of the barrier layer to the photo-active layer;

a gate layer on the opposite side of the photo-sensitive layer of semiconductor to the barrier layer and laterally overlapping the barrier layer for controlling the barrier height of the barrier layer to control conduction of electrons and holes between the source layer and the active region; and a gate insulator layer between the gate layer and the semiconductor layer;

wherein the structure allows light incident on the phototransistor to reach the active region to create electron hole pairs in the active region, the holes accumulating at the barrier to change the effective barrier height and hence the current flow between source and drain through the active region.

In use, the photocarriers created lower the barrier height markedly increasing the current through the gated transistor. The transistor accordingly has significant gain which allows for operation in low light levels.

Thus, the basic concept is to use a source gated transistor having a source barrier with an effective barrier height that is varied by carriers created in the active region. Source gated transistors are described in Shannon and Gerstner, Source-Gated Thin Film Transistors, IEEE Electron Device Letters Vol. 24, No. 6, June 2003. These prior transistors are not photo-sensitive and do not make use of charge build up to change the barrier height—instead the barrier is controlled only by the gate in such prior devices.

It should be noted that this concept differs from the concept described in GadelRab, "The Source-Gated Amorphous Silicon Photo-Transistor", IEEE Electron Devices Vol. 44 No. 10 October 1997, in spite of the similar name adopted for the two structures by the respective authors. In the GadelRab paper, there is no barrier and the transistor operates in the same manner as a conventional TFT phototransistor.

The effective barrier height to electrons may preferably be less than half the band gap so that the barrier height to holes is higher than that to electrons to retain the holes in the device.

In embodiments, the structure according to the invention makes use of the fact that holes have a higher effective mass than electrons and so are less able to tunnel though the barrier into the source layer than electrons. In this case, electrons can flow through the circuit from source to drain while holes accumulate at the barrier thereby effectively lowering the barrier height.

The device may be operated as a light detector over a predetermined frame time and with a predetermined frame gate voltage, wherein the barrier has a barrier height at the predetermined frame gate voltage such that the time constant for holes created by illumination of the active region to pass over the barrier towards the source layer is greater than the frame time but that the time constant for electrons to pass over the barrier from the source layer into the active region is less than the frame time.

The device may operate in a charge storage mode in which the holes created by light are stored at the barrier over each frame time.

At the end of each frame, the holes may be dispersed by providing a gate voltage pulse to lower the barrier height and so allow the holes to be injected into the source layer.

The phototransistor is particularly well suited to large area technologies and for integration with thin film electronics. The phototransistor may for example be used in X-ray detectors, copiers and image intensifiers.

In embodiments the source layer is of semiconductor doped to have the first conductivity type and the barrier layer is a semiconductor layer doped to have a second conductivity type opposite to the first conductivity type.

To connect to the source layer whilst still allowing light to reach the barrier and the active region, the phototransistor may include a transparent source electrode connected to the source layer.

In alternative embodiments, the barrier layer may be a very thin (less than 5 nm) insulating barrier layer. The source layer may be a transparent source electrode.

The semiconductor of the photoconductive layer may be non single-crystal semiconductor, for example doped amorphous silicon or polysilicon.

In another aspect the invention relates to a method of operating the phototransistor described above by:

(a) applying a positive reset pulse to the gate to allow holes accumulated in the photo-active layer to be injected into the source contact region;

(b) applying a frame gate voltage to the gate during a frame period, the frame gate voltage allowing any electrons created by illumination in the active region to pass the barrier but allow any holes created by illumination in the active region to accumulate in the photo-active layer at the barrier, thereby effectively reducing the effect of the barrier to electrons and increasing the electron current;

(c) reading the source-drain current as a measure of the illumination.

The method may further comprise repeating steps (a) to (c) to measure the illumination over a series of frame periods.

The invention also relates to a phototransistor array comprising an array of phototransistors according to any preceding claim arranged over a single substrate.

The array may further comprise thin-film electronics on the substrate.

BRIEF DESCRIPTION OF THE SEVERAL VIEWS OF THE DRAWINGS

Embodiments of the invention will now be described, purely by way of example, with reference to the accompanying drawings, in which.

DETAILED DESCRIPTION

It should be noted that the Figures are schematic and not to scale. In particular, the thickness of the layers is in many cases exaggerated.

Figure 1:
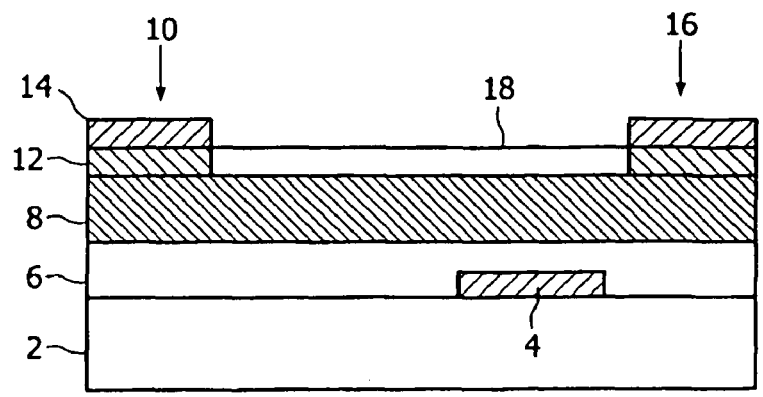
FIG. 1 shows a prior art phototransistor.
Figure 2:
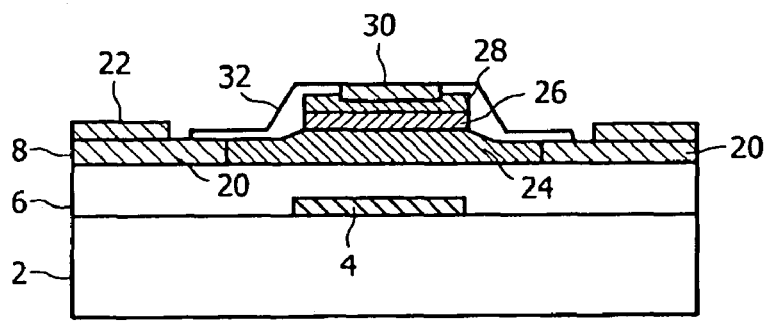
FIG. 2 shows a section through a first embodiment of the invention.

Referring to FIG. 2, a substrate 2 is provided, of glass or plastic. A gate layer 4 is formed over the substrate, and the whole surface covered in turn with a gate insulator layer 6 of Silicon Nitride. Above this is provided a layer of photosensitive semiconductor 8, which in this example comprises amorphous silicon (a-Si:H). A drain region 20 of the photosensitive semiconductor layer 8 is doped strongly n-type, and a drain contact 22 provided connecting to the drain region 20.

A thin barrier layer 26 of heavily doped p-type material is formed over an active region 24 of the photosensitive semiconductor layer 8, and a source layer 28 doped n-type is formed over the thin barrier layer 26. A transparent source electrode 30 is formed to connect to the source layer 28. In this example, the source electrode is of indium tin oxide.

In the specific embodiment the semiconductor layer 8 as deposited, and hence in the active region 24 of the final device, is undoped or lightly doped and 0.25 µm thick. The p-type barrier layer 26 is doped $10^{19}$ cm$^{-3}$ p$^+$ and is 30 nm thick, whereas the doping in the source region 28 is $10^{21}$ cm$^{-3}$ n$^+$ and the thickness is 50 nm.

As the skilled person will realise, these parameters can be varied somewhat. In particular, the thickness of the semiconductor layer can be adapted, for example to fit in to an existing process, and in embodiments the thickness may be from 0.01 µm to 10 µm, preferably 0.1 µm to 1 µm. The barrier layer thickness may be, for example, in the range 10 to 100 nm, and the source layer thickness in the range 10 nm to 1 µm. The doping in the p+ layer may be, for example, above $10^{18}$ cm$^{-3}$ and in the source region the n+ doping may be above $10^{18}$ cm$^{-3}$.

Insulator 32 is provided around the source electrode above the source layer. The insulator extends over the edges of the source layer 28 and barrier layer 26 and over the active region 24 of the semiconductor layer 8. The structure shown has a drain region 20 on both sides of the active region 24, but in alternative embodiments the drain region 20 may be provided on one side only of the active region 24.

Figure 3:
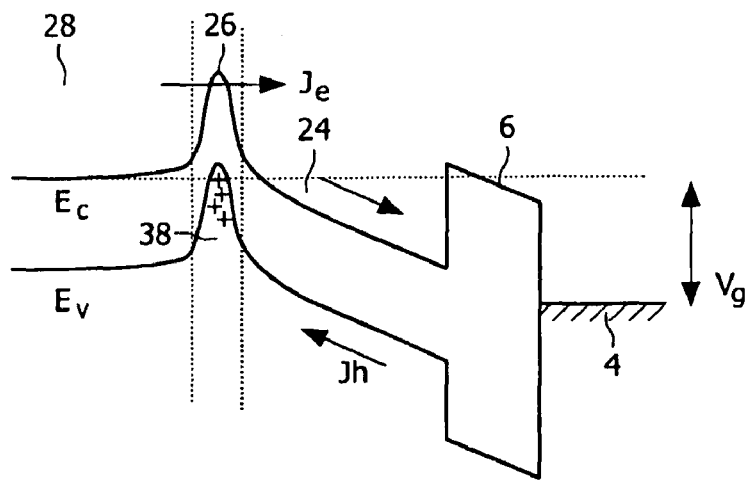
FIG. 3 shows band diagrams of the first embodiment of the invention with a first gate voltage applied.

In use, as illustrated in FIG. 3, a predetermined positive frame gate voltage, $V_g$, is applied to the gate 4 resulting in the band diagram of FIG. 3. The barrier layer 26 forms a barrier to the transport of electrons and holes as indicated in the band diagram.

Light incident on the phototransistor reaches the active region 24 by passing through the transparent source electrode 30 and thin source layer 28 and barrier layer 26. In the active region, the incident light creates electron-hole pairs. An electron current passes from source to drain over the barrier, the electron carriers created in the active region 24 carrying the current in the active region 24 to the drain region 20.

The frame gate voltage is selected so that there is a large barrier to electrons so maximising the background leakage current and a large potential well for holes. Holes 38 generated by the light drift into the barrier region 26 where they are trapped. The effect of this accumulation of positive charge at the barrier is to compensate for the negatively charged ionized acceptors in the barrier layer 26 and so reduce the effective barrier height and so increase the current of electrons that flows between source and drain through the active region. Thus, the effect of a small number of electron hole pairs is to create a large effect on the current. Thus, the device has significant gain.

The device operates in this charge storage mode, accumulating charge, for a frame period. At the end of this period the current through the device provides a measure of the incident illumination. To a first approximation, the current will be exponentially dependent on the light intensity during the frame period.

The arrangement has the considerable benefit that because the current is largely determined by the barrier the current is insensitive to drain voltage. This means that the output of the phototransistor is a high impedance current is source, which makes the phototransistor easy to interface to electronic circuitry.

Figure 4:
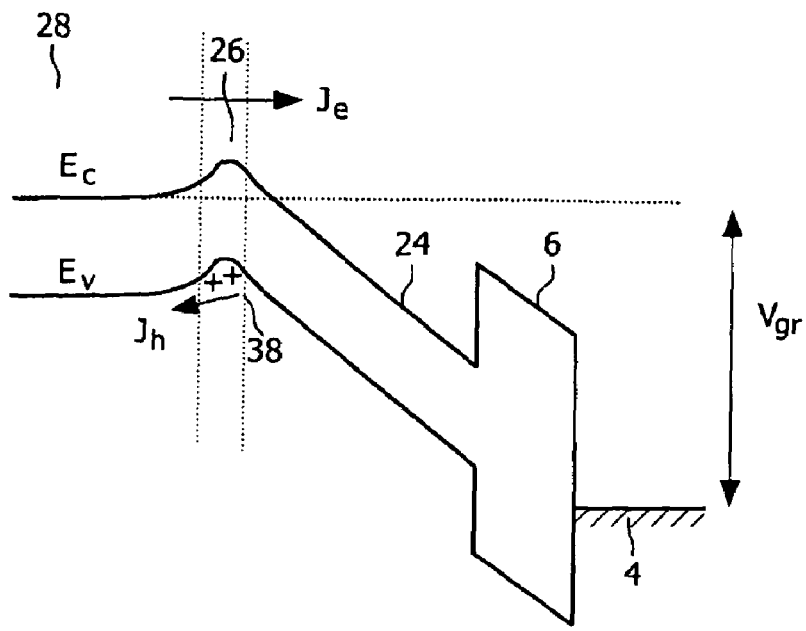
FIG. 4 shows a band diagram of the first embodiment of the invention with a second gate voltage applied.

After the frame time is over, a large positive reset voltage pulse, $V_{gr}$, is applied to the gate as illustrated in FIG. 4 and this reduces the height of the barrier to a level in which the holes 38 accumulated in the barrier 26 readily cross the barrier into the source region 28. Thus, in the arrangement according to the invention it is readily possible to disperse the accumulated holes in a short time and reset it allowing frequent measurements to be made.

After the reset voltage pulse, the voltage on the gate is returned to the predetermined frame voltage and the next frame period starts.

Figure 5:
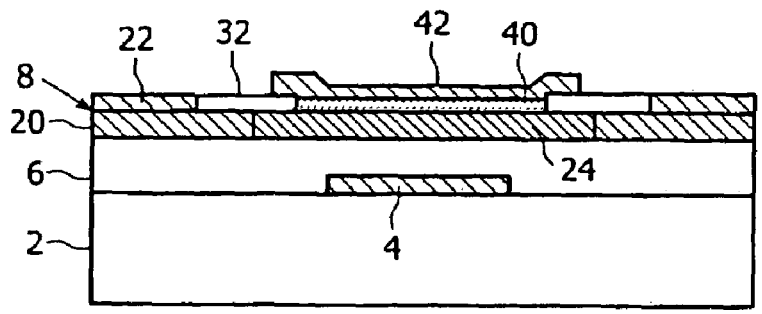
FIG. 5 shows a section through a second embodiment of the invention.
Figure 6:
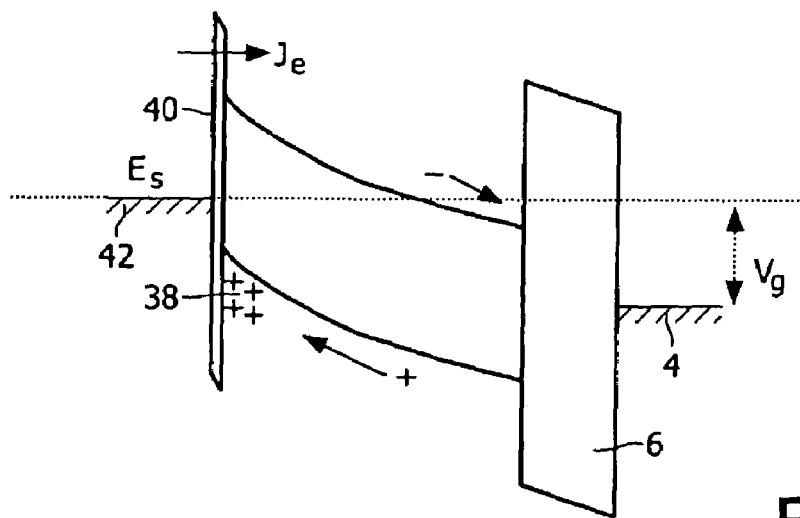
FIG. 6 shows a band diagram of the second embodiment of the invention with a first gate voltage applied.
Figure 7:
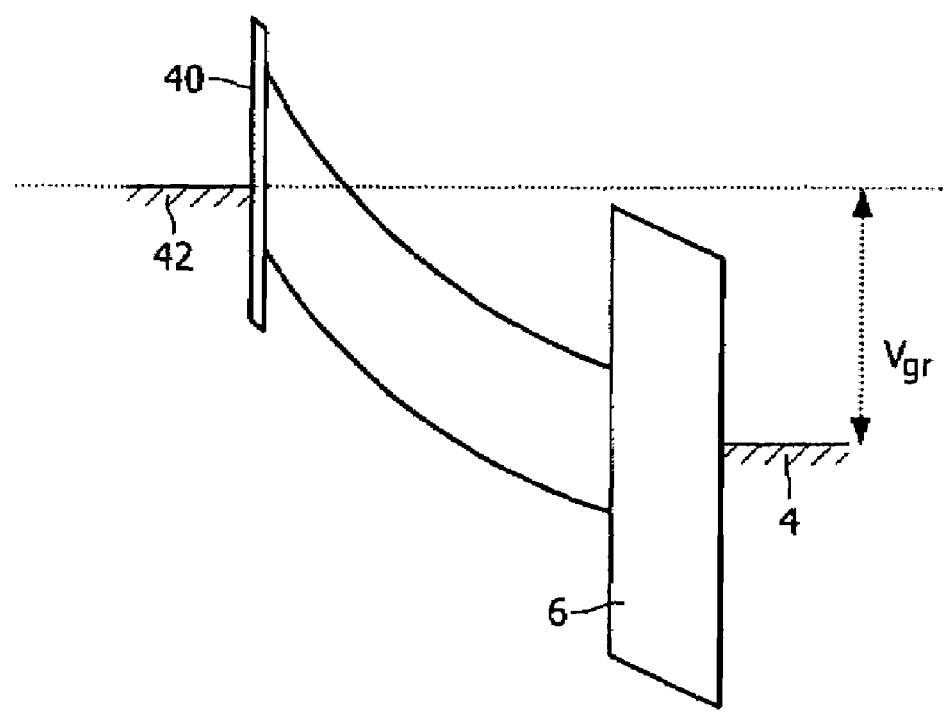
FIG. 7 shows a band diagram of the second embodiment of the invention with a first gate voltage applied.

In a second embodiment, illustrated in FIGS. 5 to 7, the barrier is formed by thin insulating layer 40 formed on the active region 24 of the photosensitive layer 8, which in this case is of polysilicon. The thin insulating layer 40 is formed in an opening in insulating layer 32. A transparent metallic source contact layer 42 is formed over the barrier layer 40. The barrier is a thin layer formed in the specific example shown by oxidising the polysilicon layer 8 by boiling in hydrogen peroxide. Typically, the barrier will be about 2 nm thick. As in the first embodiment, a gate 4 is separated from the active region by gate insulator 6.

In use, the higher mass of holes means that they are much less likely to tunnel through the barrier than electrons and so the holes accumulate in the active region 24 adjacent to the insulating barrier 40. These accumulated holes have the effect of increasing the electric field across the oxide thereby increasing the probability of electron tunneling through the thin barrier from the source contact 42 to semiconductor layer 8.

Operation of the device can accordingly proceed as in the first embodiment, as illustrated in FIGS. 6 and 7 which show the band diagram at the frame gate voltage $V_g$ (FIG. 6) and the reset gate voltage $V_{gr}$ (FIG. 7). Increasing the positive voltage on the gate increases the electric field across the thin insulating film 40 and reduces the effective barrier height.

In this embodiment, the holes 38 of electron-hole pairs created by illumination accumulate at the barrier 40, increasing the field and hence increasing the number of electrons that can tunnel through the insulator and so reduce the effective barrier height to electrons. When a large positive voltage is applied to the gate a large field is created (FIG. 7) and holes are also able to tunnel through the insulator into the source contact 40 thus resetting the device.

As will be appreciated by the skilled person, the barrier will not completely prevent all holes crossing it and allow all electrons to cross it. However, the differential ability of electrons and holes to cross the barrier means that the barrier height and predetermined voltage can be selected such that the time constant for electrons to cross the barrier is less than the frame time whereas the time constant for holes to cross the barrier is greater than the frame time. In this way, holes tend to accumulate whereas electrons can pass the current.

Figure 8:
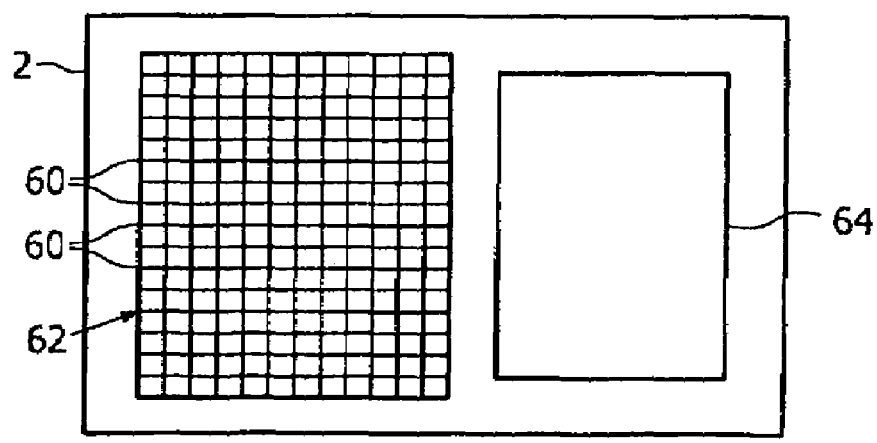
FIG. 8 shows an array of phototransistors integrated with electronics on a substrate.

As shown in FIG. 8, an array 62 of phototransistors 60 according to the invention may be provided on a substrate together with thin film electronic circuitry 64 connected to the phototransistors 60. The precise nature of the circuitry can depend on the application.

The phototransistors according to the invention are particularly suitable for large area technologies and large area imaging devices. Applications include X-ray detectors, copiers and image intensifiers.

The skilled person will realise that alternative implementations of the invention are possible. For example, any suitable semiconductor can be used as the active layer including non-single crystalline semiconductors of varying type. It is possible for the gate to be formed above the active layer, rather than below the active layer, and likewise the source contact 30 or source electrode 40 can be below the source instead of above. Further insulating layers, passivation layers and other protective layers can be provided at locations and using methods to suit a variety of processes, if required.

The particular layers that are transparent can be changed if required and in particular a transparent substrate may be used so that incident light can reach the active region through the substrate instead of requiring the top contact above the barrier to be transparent.

The particular barrier heights and predetermined gate voltages can be adjusted to suit varying applications as will be appreciated by those skilled in the art.

The invention claimed is:

1. A phototransistor, comprising:
   a photo-sensitive semiconductor layer;
   a barrier layer extending across an active region of the semiconductor layer;
   a drain region laterally spaced from the active region of the semiconductor layer;
   a drain contact connected to the drain region;
   a source layer on the other side of the barrier layer to the semiconductor layer;
   a gate layer on the opposite side of the semiconductor layer to the barrier layer and laterally overlapping the barrier layer for controlling the barrier height of the barrier layer to control conduction of electrons and holes between the source layer and the active region; and
   a gate insulator layer between the gate layer and the semiconductor layer;
   wherein the phototransistor allows light incident on the phototransistor to reach the active region to create electron hole pairs in the active region, the holes accumulating at the barrier to change the effective barrier height and hence the current flow between source layer and drain region through the active region.

2. A phototransistor according to claim 1 wherein the source layer is of semiconductor doped to have the first conductivity type and the barrier layer is a semiconductor layer doped to have a second conductivity type opposite to the first conductivity type.

3. A phototransistor according to claim 2 further comprising a transparent source electrode connected to the source layer.

4. A phototransistor according to claim 1 wherein the barrier layer is an insulating barrier layer.

5. A phototransistor according to claim 4 wherein the source layer is a transparent source electrode.

6. A phototransistor according to claim 1 wherein the semiconductor layer is of doped amorphous silicon.

7. A phototransistor according to claim 1 wherein the effective barrier height of the barrier to electrons is be more than half the band gap.

8. A phototransistor array comprising:
   an array of phototransistors arranged over a single substrate, each phototransistor including:
      a photo-sensitive semiconductor layer;
      a barrier layer extending across an active region of the semiconductor layer;
      a drain region laterally spaced from the active region of the semiconductor layer;
      a drain contact connected to the drain region;
      a source layer on the other side of the barrier layer to the semiconductor layer;
      a gate layer on the opposite side of the semiconductor layer to the barrier layer and laterally overlapping the barrier layer for controlling the barrier height of the barrier layer to control conduction of electrons and holes between the source layer and the active region; and
      a gate insulator layer between the gate layer and the semiconductor layer;

wherein the phototransistor allows light incident on the phototransistor to reach the active region to create electron hole pairs in the active region, the holes accumulating at the barrier to change the effective barrier height and hence the current flow between source layer and drain region through the active region.

9. A phototransistor array according to claim 8 further comprising thin-film electronics on the substrate.

10. A method of operation of a phototransistor that includes a photo-sensitive semiconductor layer; a barrier layer extending across an active region of the semiconductor layer; a drain region laterally spaced from the active region of the semiconductor layer; a drain contact connected to the drain region: a source layer on the other side of the barrier layer to the semiconductor layer: a gate layer on the opposite side of the semiconductor layer to the barrier layer and laterally overlapping the barrier layer for controlling the barrier height of the barrier layer to control conduction of electrons and holes between the source layer and the active region; and a gate insulator layer between the gate layer and the semiconductor layer; wherein the phototransistor allows light incident on the phototransistor to reach the active region to create electron hole pairs in the active region, the holes accumulating at the barrier to change the effective barrier height and hence the current flow between source layer and drain region through the active region, the method comprising:

(a) applying a positive reset pulse to the gate to allow holes accumulated at the barrier to tunnel out into the source layer;

(b) applying a frame gate voltage to the gate during a frame period, the frame gate voltage allowing any electrons created by illumination in the active region to pass the barrier but allow any holes created by illumination in the active region to accumulate at the barrier, thereby reducing the effective height of the barrier to electrons;

(c) reading the source-drain current as a measure of the illumination.

11. A method according to claim 10 comprising repeating steps (a) to (c) to measure the illumination over a series of frame periods.

* * * * *